(12) United States Patent
Rey-Garcia et al.

(10) Patent No.: US 9,780,252 B2
(45) Date of Patent: Oct. 3, 2017

(54) METHOD AND APPARATUS FOR REDUCTION OF SOLAR CELL LID

(71) Applicants: Luis Alejandro Rey-Garcia, Long Beach, CA (US); Peter G. Ragay, Anaheim, CA (US)

(72) Inventors: Luis Alejandro Rey-Garcia, Long Beach, CA (US); Peter G. Ragay, Anaheim, CA (US)

(73) Assignee: TP SOLAR, INC., Paramount, CA (US)

( * ) Notice: Subject to any disclaimer, the term of this patent is extended or adjusted under 35 U.S.C. 154(b) by 0 days.

(21) Appl. No.: 14/882,737

(22) Filed: Oct. 14, 2015

(65) Prior Publication Data

US 2016/0111586 A1 Apr. 21, 2016

Related U.S. Application Data

(60) Provisional application No. 62/065,441, filed on Oct. 17, 2014.

(51) Int. Cl.
*H01L 31/028* (2006.01)
*H01L 31/18* (2006.01)
(Continued)

(52) U.S. Cl.
CPC .......... *H01L 31/186* (2013.01); *H01L 21/677* (2013.01); *H01L 21/6776* (2013.01);
(Continued)

(58) Field of Classification Search
None
See application file for complete search history.

(56) References Cited

U.S. PATENT DOCUMENTS 7,805,064 B2 9/2010 Ragay et al.
8,039,289 B2 10/2011 Parks et al.
(Continued)

FOREIGN PATENT DOCUMENTS

CN 104078403 A 10/2014

OTHER PUBLICATIONS

System Specification, c.REG 6.200-380, Centrotherm, 6pp brochure, Version 1.2 Jun. 16, 2015.

*Primary Examiner* — Jay C Chang
(74) *Attorney, Agent, or Firm* — Innovation Law Group, Ltd.; Jacques M. Dulin, Esq.

(57) ABSTRACT

Reduction of solar wafer LID by exposure to continuous or intermittent High-Intensity full-spectrum Light Radiation, HILR, by an Enhanced Light Source, ELS, producing 3-10 Sols, optionally in the presence of forming gas or/and heating to within the range of from 100° C.-300° C. HILR is provided by ELS modules for stand-alone bulk/continuous processing, or integrated in wafer processing lines in a High-Intensity Light Zone, HILZ, downstream of a wafer firing furnace. A finger drive wafer transport provides continuous shadowless processing speeds of 200-400 inches/minute in the integrated furnace/HILZ. Wafer dwell time in the peak-firing zone is 1-2 seconds. Wafers are immediately cooled from peak firing temperature of 850° C.-1050° C. in a quench zone ahead of the HILZ-ELS modules. Dwell in the HILZ is from about 10 sec to 5 minutes, preferably 10-180 seconds. Intermittent HILR exposure is produced by electronic control, a mask, rotating slotted plate or moving belt.

7 Claims, 8 Drawing Sheets

(51) Int. Cl.
*H01L 21/67* (2006.01)
*H01L 21/677* (2006.01)
*H05B 3/00* (2006.01)

(52) U.S. Cl.
CPC .. *H01L 21/67115* (2013.01); *H01L 21/67173* (2013.01); *H01L 31/028* (2013.01); *H01L 31/1864* (2013.01); *H05B 3/0047* (2013.01)

(56) References Cited

U.S. PATENT DOCUMENTS

| | | |
|---|---|---|
| 8,236,596 B2 | 8/2012 | Parks et al. |
| 8,263,176 B2 | 9/2012 | Herguth et al. |
| 8,571,396 B2 | 10/2013 | Ragay et al. |
| 8,742,532 B2 | 6/2014 | Rey Garcia et al. |
| 8,816,253 B2 | 8/2014 | Parks et al. |
| 8,828,776 B2 | 9/2014 | Parks et al. |
| 8,829,396 B2 | 9/2014 | Rey Garcia et al. |
| 2013/0208469 A1* | 8/2013 | Progl .................. F21V 29/506 362/235 |
| 2014/0017848 A1 | 1/2014 | Ragay et al. |
| 2014/0238490 A1 | 8/2014 | Haarahiltunen et al. |
| 2016/0005915 A1* | 1/2016 | Tjahjono ........... H01L 21/67115 438/14 |

* cited by examiner

METHOD AND APPARATUS FOR REDUCTION OF SOLAR CELL LID

CROSS-REFERENCE TO RELATED CASE

This is the Regular US Patent Application corresponding to, and claiming priority of, U.S. Provisional Application 62/065,441 filed Oct. 17, 2014 of the same inventors under the title Solar Cell Boron Passivation System, the benefit of the filing date of which is claimed under 35 USC §§119 and 120.

FIELD

The invention relates to apparatus and methods for processing solar cell wafers, and more particularly to systems for reduction of Light Induced Degradation, herein "LID", either before or after metallization firing, by use of High-Intensity full-spectrum Light Radiation of heated wafer surface(s), herein "HILR", to which Boron or a Boron-containing compound or component has been applied (also known as passivating Boron applied to at least one surface of a wafer). The HILR treatment of the wafer surface may be done in a High-Intensity Light Zone, herein HILZ", in ambient atmosphere, or preferably in a controlled atmosphere, such as a forming gas comprising from 2-90% $H_2$ in a Nitrogen carrier gas, in either bulk (batch) processing, or in a continuous processing line. The HILR/heat treatment is effected in the HILZ at temperatures in the range of from about 100° C. to about 300° C. The HILR is applied via an Enhanced Light Source (herein "ELS"), such as a Light Emitting Plasma (LEP) or Xenon lamp source, preferably housed in a module containing at least one ELS and producing, at the wafer surface from 3-10 Sols (Suns) of full-spectrum radiation (visible, IR and UV), and may be continuous or intermittent. One or more ELS modules may be used in separate locations in a processing line system, or may be disposed adjacent each other as a series of ELS modules arrayed in a continuous zone, the HILZ, in the processing line apparatus system. The HILR/heat treatment HILZ may be followed by a controlled temperature heating zone which serves to anneal the treated wafers before discharge for further production steps to aggregate them into solar panels.

BACKGROUND

Solar panels contain a plurality of solar cells comprising electrically connected solar wafers in an array which is then sealed between glass sheets. Current high efficiency solar panels have an initial output on the order of 20-22% cell efficiency (conversion of solar energy into electricity), but after about 2 weeks, drops off by over 10% into a typical range of 17-18%. However, the common solar panels made in the US have efficiencies that peak around 13% initially, and fall off well below that after being put into service use. This efficiency fall-off phenomena is called Light-Induced Degradation (LID). While the mechanism is not precisely known, research points to the correlation of Boron content to LID, it being postulated that Boron-Oxygen Complexes (BOCs) of uncertain empirical formula(s) are formed in the wafers upon exposure to sunlight. These complexes in the silicon are generally characterized as $B_5O_{2i}$ as a result of post-production in-service-use exposure to light.

Among the highest initial solar cell conversion efficiencies are Boron doped MCz (Magnetic Czochralski) silicon wafers. Typically the Boron is doped into the silicon surface that later becomes the back contact surface as a result of coating (Printing) it with silver compound-containing paste which is then fired in a metallization furnace to form the silver back contact layer. However, the metallization does not prevent the LID of Boron after a few days to weeks of service, resulting in efficiency fall-off. To date there has been no process for preventing Boron-Oxygen complex LID of the solar cells, nor for their permanent regeneration back to original efficiency.

Amorphous silicon, α-Si, wafers experience LID on the order of 10-15% over their first 6-months of in-use service life. Crystalline silicon, c-Si, wafers experience LID on the order of 3-7%. In α-Si LID is also known as the Staebler-Wronski effect (SWE), which can stabilize at lower Solar Conversion Efficiency (SCE) levels after about 6-months of in-use service exposure to sunlight. In mono-crystalline silicon cells, the main cause of the LID effect is a recombination-active Boron-Oxygen complex. These complexes affect the carrier lifetime (rate at which the carriers recombine). The more B—O Complexes (BOCs) there are in the wafers, the faster the carriers recombine, reducing output. Experiments have been reported on exposure of solar cell wafers with light at 1 Sol intensity for several hours in an attempt to reduce LID effects. Such light exposure experiments have not been applied to industrial in-line wafer processing furnace systems. The results have not been satisfactory to date.

Accordingly, there is an unsolved need in the solar wafer processing field to produce wafers that do not exhibit efficiency degradation (LID), or exhibit a significant reduction of the amount or rate of LID, upon mounting as solar wafers as cells in solar panels that are put in service in the field. Further, any process that can reduce or prevent LID, or treat the wafer to regenerate it after metallization back to a stable initial efficiency state, must be solved in the context of being able to be retrofit into current wafer processing furnace apparatus, at production rates and yields that are economically feasible.

THE INVENTION

Summary

The invention comprises apparatus for, and method of, treatment of silicon solar cell wafers, by radiation treating during controlled heating, at least the Boron-treated side or surface of such wafers with High-intensity full-spectrum Light Radiation, herein "HILR", in the range of 3-10 Sols (Suns) continuously or intermittently (strobed) in one or more High-Intensity Light Zones, herein "HILZ", for a time sufficient to reduce or prevent the LID effect, and as either part of an integrated wafer processing furnace system (preferred), or as a stand-alone HILZ with its own conveyor that can serve a plurality of furnaces or processing lines feeding their output to it. The inventive HILZ apparatus may also be set up for bulk processing of a plurality of wafers disposed in a static array.

By way of non-limiting examples, the inventive apparatus and process may be applied to wafers of: amorphous silicon, α-Si; crystalline silicon, c-Si; mono-crystalline silicon, mono-Si; nano-crystal silicon, n-Si; polycrystalline silicon, multi-Si; and micromorph (tandem cell) wafers using amorphous silicon interspersed with micro-crystalline silicon, α-Si/μc-Si. However, one skilled in the art will recognize that the inventive apparatus and process may be employed with any type of solar cells that experience LID effects.

The term "full-spectrum" means visible spectrum light as well as IR and UV. Preferably the HILR/heating is carried out in the HILZ in the presence of a forming gas comprising from 2-90% $H_2$ gas with the balance being an inert carrier gas such as Nitrogen. Whether the inventive HILR/heating process passivates one or more Boron-Oxygen complexes (BOCs) that may form in the silicon of the wafers, passivates other complex(es), prevents or reduces the formation of such complex(es), or renders such complex(es) more stable, e.g., by maintaining the complex static or preventing its conversion to another state, is not fully understood or determinative of the efficacy of the inventive process. Accordingly, reference herein to reduction or elimination of LID, deactivation or "freezing" of the BOC or other complex(es), passivation of Boron, or recovery or restoration of initial cell efficiency in whole or in part, is meant to cover any of the mechanisms by which the LID reduction effect of the inventive HILR/heating process may ultimately be determined to occur.

While we do not wish to be bound by theory, on a gross chemical approach, wafer silicon typically has a content of Oxygen present in the crystalline structure. Accordingly, one aspect of the inventive HILR/heating process may result in extracting or "getting" Oxygen atoms or ions that may be in the silicon substrate, or which are chemically bound or associated-with the Boron in a BOC as a result of Boron being doped into the silicon. Typically, Boron is coated on or doped into the surface of the wafer that will form the back contact layer surface of the wafer, while Phosphorous is coated on the top surface of the wafer, onto which a fine-line collector grid will be screen printed.

The inventive process and HILR/heating apparatus is integrated into an industrial solar cell wafer processing line, including apparatus for and methods of: 1) UV pre-treatment of wafers (optional); 2) P-compound dopant coating, e.g., Phosphoric Acid, on a wafer surface that will become the emitter surface, typically the top surface; 3) optionally, coating with a B-compound on the opposite surface of the wafer, typically the bottom surface; 4) diffusion firing the wafer (in the case of P coating) or co-diffusion firing (in the case of both P and B coating) in an IR diffusion furnace; 5) application of an Anti-Reflective Coating (ARC) to the P-emitter top surface of the wafer (such as a silicon nitride PECVD coating); 6) screen printing a fine-line silver paste onto the top side (P side) of the wafer to form the collector grid, and coating the back side of the wafer with aluminum paste for the back contact layer; 7) drying the printed pastes; 8) metallization firing of the wafer, in a multi-zone IR metallization furnace, to control-melt the top surface fine lines of silver paste through the ARC layer into the P-doped Si, and fully melting the Al paste coated on the bottom surface to form a continuous back-contact layer of the wafer, followed by rapid quenching of the wafers; 9) HILR/heating treatment of the wafers in an HILZ at 3-10 Sols in the range of from about 100° C. to about 300° C. for a period of from about 10 seconds to about 5 minutes (about 300 seconds), and more preferably in the range of from about 10 seconds to about 180 seconds, the dwell time (wafer transport time through the HILZ) being a function of the light intensity at the wafer surface in the range of from about 3 to about 10 Sols, the rate of conveyor travel, and the length of the ELS array in the HILZ; and 10) an optional tempering, heat treatment zone. Typically, the metallization furnace line includes, adjacent its input end, a burn-out zone in which the organic binders of the pastes are first "burned-off", by being heated to convert the binders to volatile gas which is drawn off. With respect to UV pre-treater and Dopers modules, exemplary ones are shown in our U.S. Pat. No. 8,742,532.

It is particularly important for transport of the wafers through the line during metallization firing to have a short dwell time, on the order of 1-2 seconds, in the peak firing zone of the IR metallization furnace. During the time of transport through the peak firing zone, also known as "the dwell time", the temperature peaks very rapidly to the preselected maximum temperature for the selected wafer/paste(s) composition. The wafers are immediately thereafter cooled rapidly in a quench zone, which is the zone next downstream of the peak zone. Again, while we do not wish to be bound by theory, we find that the short dwell time in the peak zone helps to prevent or reduce BOC formation.

It is preferable, but not absolutely necessary, that the wafers are fired in at least the IR peak firing zone of the metallization furnace in the presence of the forming gas described above. In this firing embodiment, it is convenient to use a metallization furnace employing an isolation IR lamp module, in which quartz window(s) separate(s) the processing zone, through which the wafers are transported, from the lamps. An exemplary furnace employing one or more isolation lamp module(s) in the peak firing zone is set forth in our U.S. Pat. No. 7,805,064. Where a forming gas is not used, an exemplary furnace is shown in our U.S. Pat. No. 8,571,396, or in US published Application 2014/0017848 A1.

With respect to wafer transport systems, wire mesh belts such as shown in our U.S. Pat. No. 7,805,064 may be used. However, an ultra-low mass transport system such as shown in our U.S. Pat. Nos. 8,039,289, 8,236,596 and 8,828,776 may be employed. As to transports, single or dual- and multi-lane wide transport belts, ultra-low mass, or zero mass shadowless finger drive systems may be employed in the furnace system. The transport systems are driven synchronously by a single drive system (motor and associated gears, jack shafts, chains and the like), or by separate, independently controllable drive systems, such as shown in our U.S. Pat. No. 8,816,253.

The preferred transport system, as used in the exemplary embodiments herein, is a "Zero Mass", "Shadowless" finger drive system, as described in detail in our U.S. Pat. No. 8,829,396. This finger drive system permits high speed operation on the order of 200-400 inches/minute, very short dwell times in (transport through) the peak firing zone on the order of 1-2 seconds. This Shadowless finger drive system may be used in an IR furnace configured with an isolation lamp module so that forming gas may be used in the peak firing zone followed by a compressed gases quench zone (forming gas may be used in the quench jets). Another advantage of the Shadowless finger drive system is that it permits exposure on both sides of the wafer simultaneously or sequentially, with no belt structure shadowing the underside of the wafers. Thus, in the ELS module of the inventive HILZ, the forming gas accesses both the top and bottom sides of the wafers so that this gas can permeate the Silicon of the wafers more efficiently to assist in passivation or LID reduction. It should be understood that individual ELS modules, or the HILZ, may include isolation windows so that the forming gas may be kept separate from the lamps of the ELS modules.

In accord with the inventive HILZ system, the full-spectrum high radiation intensity of the ELS modules is maintained in the range of 3-10 Sols, preferably on the order of greater than 4 Sols. While we do not wish to be bound by theory, under this level of full-spectrum radiation, a portion of the $H_2$ of the forming gas dissociates, forming a proton component (e.g., a "protium", hydrogen-1, $^1H$, isotope or ion), which is $1/64,000^{th}$ the size of the hydrogen atom and thus more permeable into the silicon crystalline structure of the wafer. It is believed that the protium isotope is "injected" into the wafers by the radiant energy. With respect to the term "Sols" used herein, the solar power density at the equator on a bright day at noon is about 1000 watts per square meter ($10^3$ W/m$^2$) which is equivalent to $10^5$ Lux. This value is called a "standard sun" or "Sol", thus the range used herein is $3\times10^3$-$10^4$ watts/m$^2$. The higher the intensity, in Sols, the shorter the exposure time that is required to reduce the detrimental LID effect on wafers used in solar cell panel arrays. This translates into shorter HILZ zone with fewer ELS modules. We also have found that intermittent exposure, an ON/OFF strobing effect exposure, is effective in reducing the LID. While we do not wish to be bound by theory, it is presently thought that the alternating intervals of HILR exposure (ON) compared to dark (OFF) prevents $B_sO_{2i}$-type BOC formation, or the uncoupling of such complexes. The light initiates the BOC breakdown, which then proceeds during the dark interval. The ON/OFF intervals are on the order of less than 1 second. We have found that a shadow mask produces effective strobing for ELP lamps, and Xenon, Halogen and LED lamps may be electronically controlled for the ON/OFF strobing effect.

In a first apparatus embodiment, a high-intensity full-spectrum (as defined above) Enhanced Light Source ("ELS") is provided in one or more module(s) that is/are installed in-line in a wafer processing line so that the LID treatment is effected as part of a continuous wafer firing operation. The ELS module(s) may be placed at any suitable place in the processing line, two alternative locations being described herein by way of example. In these examples the ELS module(s) are shown above the line, that is, above the top surface of the wafer as it is transported along the processing line for treatment, but it should be understood that the invention includes disposing the ELS modules above and/or below the wafer transport path, depending on the wafer surfaces to be treated with high-intensity radiation. Several embodiment configurations of the ELS modules are disclosed by way of example: Example I) single, solid state electrode-less lamp, employing a solid-state device to generate RF energy that powers a plasma emitter, with water cooled plasma generator engine and air-cooled parabolic reflector as shown in detail in FIG. 4 herein; Example II) an array of bulb-type plasma lamps, Light Emitting Plasma lamps (herein "LEP" lamps), in air- or water-cooled housing as shown in detail in FIGS. 6A and 6B herein; and Example III) high-intensity Xenon, Halogen or LED lamps, in which the lamps are air- or water-cooled, as and if needed. Typically in these exemplary embodiments, the wafers are heated from below by platen heaters or by open coil-type resistance heaters.

Other high-intensity discharge lamps may be used for the ELS to produce the necessary range of light radiation (3-10 Sols), but the LEP module lamps of Example II, as used herein have the advantage of reliability, an order of magnitude higher lumen density from each lamp device, a full color spectrum having a color-rendering index up to about 95, and the ability to be controlled for light intensity down to 20% full brightness (dimming or "turn-down"). LEP lamps are available commercially, being used as grow lamps, for area and high mast lighting, such as parking lots, roadways, in high-bay industrial and commercial facilities (e.g., membership warehouse stores, and super-centers), and in entertainment and architectural lighting installations. The Example II LEP lamps are also available commercially being principally used in agricultural hydroponic and aeroponic grow facilities, and in industrial and commercial facilities. Similarly, high-intensity Zenon and Halogen ELS lamps have suitable full spectral output and can produce the radiation intensity required for the inventive high speed, in-line LID treatment.

In one embodiment, one or more of the wafer surface(s), e.g., top surface, is/are continuously exposed to the ELS full-spectrum high-intensity light in the HILZ. In an alternate embodiment, one or more of the wafer surface(s) is/are exposed intermittently to the light, e.g.: 1) by ON-OFF electronic switching of the ELS lamp sources, e.g., LED, Zenon or Halogen; 2) by use of a slotted mask between the ELS lamps and the wafers, e.g., LEP lamp; or 3) by use of a rotating, slotted disk, also for an LEP lamp. The mask or rotating disk projects alternating bands of full-spectrum high-intensity radiation, HILR, (ON) and reduced intensity shadow (OFF) onto the wafer top surface as the wafer is transported along the treatment path, creating an intermittent ON/OFF, strobing effect. In the latter two embodiments, the reduced intensity (shadow) band functions as the OFF mode for the ELS lamp even though the ELS is still continuously ON. The use of the mask or rotating slotted disk lengthens the ELS service life, which is otherwise shortened by frequent ON-OFF cycling. The widths of the mask slots and solid "lands" are selected in relation to the rate of wafer transport to provide reduced intensity shadow ("OFF") during a selected percentage of the dwell time of the wafer traversing under an ELS while in the HILZ. While we do not wish to be bound by theory, the intermittent ON/OFF high-intensity full-spectrum radiation exposure assists in the decoupling of BOCs in the wafer body, thereby improving LID reduction.

In a first example: HILZ Location A, Examples I, II or III ELS module(s) are placed downstream of a diffusion furnace, e.g., between an ARC (Anti-Reflective Coating) module and the printing module. Where the Boron is coated on or doped into the silicon wafer surface upstream of the diffusion furnace, the inventive ELS module immediately follows the diffusion furnace or the ARC module before the paste is applied to the back contact Boron-treated surface.

In a second exemplary location: HILZ Location B, Examples I, II or III ELS module(s) are disposed downstream of the quench zone of a metallization furnace, just downstream of the furnace firing zone, and upstream of the annealing zone.

The ELS module radiation treatment may be applied to one or both sides of the wafers, and preferably to the Boron-treated side. The amount of radiation is measured in Sols, meaning the light flux of sunlight at noon at the equator on a clear day. The inventive modules are configured with ELS sources to provide from 3-10 Sols of radiation. The dwell time of the wafers transiting through the HILZ under ELS radiation is inversely proportional to the speed of transport of the wafers and will typically range from about 10 seconds to about 5 minutes, more preferably from about 10-180 seconds. To increase the radiation flux in the 3-10 Sol range the number of ELS lamps, the number of ELS modules in series (each having one or more ELS lamp(s), or the lamp output may be increased for a given dwell time. Lamp output is controlled and adjusted by means of a controller that controls voltage and/or amperage to the lamps. The full-spectrum light source for the high-intensity radiation ELS modules is preferably a Light Emitting Plasma source, but may also include a high-intensity LED source, or Xenon or Metal Halide high intensity discharge source.

The wafer transport may include current wire mesh belts. However, where the underside of the wafer is to be treated in a diffusion furnace or a metallization furnace, a zero-mass finger drive of the type disclosed in our U.S. Pat. No. 8,829,396 is preferred. In the detailed examples below, a finger drive is used and shown in the drawings. The finger drive has the advantage of being essentially zero mass, and the wafers cool much more quickly, as there is no heated belt mass to retain residual heat that slows cooling. Thus, using a finger drive, the wafer upon reaching the peak temperature in the peak firing zone can be immediately cooled in the quench zone to the temperature required for the full-spectrum radiation treatment of the instant process invention.

In accord with the principles of the invention, it will be evident to those skilled in the art that the visible spectrum radiation may be supplied by any high-intensity full-spectrum light source, and the ELS modules may be integrated with any type of metallization furnace having an annealing section. The light sources (lamps) output is controlled by any suitable controller to provide the light intensity within the preferred 3-10 Sols range, and to provide selected output and turn-down as needed during processing. The ELS modules may be also used as separate modules inserted at any suitable point in the wafer processing line, such as upstream of the metallization firing furnace, or both downstream and upstream of that firing furnace. ELS modules may be used with or without a forming gas, and with or without wafer heating during the radiation treatment. The wafer heating during radiation may be accomplished by a wide variety of means, including platen, open resistance wire coils, or lamp heating. Any type of wafer transport may be used, including standard wire mesh belts, ultra-low mass drives, ceramic roller drives, and zero-mass finger drive systems. The transport system may be single or multiple lane, either driven synchronously off a single jack shaft or independent side-by-side drives. In the case of side-by-side drives, a single furnace width may be longitudinally divided to provide two or more wafer transport and processing lanes, which dividers permit isolation of each lane for independent control therein. One skilled in this art of wafer treatment will easily recognize that in accord with the teaching of this application, the particular schedule of diffusion, metallization firing, and HILZ LID reduction treatment (BOC passivation, deactivation, wafer energy conversion back to near initial state, or conversion efficiency restoration) may be controlled and modified for particular types and sizes of wafers, and may be tailored to the doping components and paste compositions.

It should be understood that "shadowless" and "shadow mask" as used herein are not the same and are not to be confused. Shadowless refers to a type of transport system in which the underside (bottom surface) of the wafers are not occluded (shadowed) by furnace mechanisms, such as conveyor transport members of conventional furnaces. In contrast, shadow mask refers to a physical element interposed between the ELS bulb and the wafer to produce a strobing of the HILR (intermittent ON/OFF of the HILR) as the wafers are transported through the HILZ.

BRIEF DESCRIPTION OF THE DRAWINGS

The invention is described in more detail with reference to the drawings, in which:

FIGS. 7A-7D are a related series of views showing use of a shadow mask to produce intermittent, strobing, high-intensity full-spectrum light treatment of wafers, in which:

DETAILED DESCRIPTION OF THE INVENTION

The following detailed description illustrates the invention by way of example, not by way of limitation of the scope, equivalents or principles of the invention. This description will clearly enable one skilled in the art to make and use the invention, and describes several embodiments, adaptations, variations, alternatives and uses of the invention.

In this regard, the invention is illustrated in the several figures, and is of sufficient complexity that the many parts, interrelationships, and sub-combinations thereof simply cannot be fully illustrated in a single patent-type drawing. For clarity and conciseness, several of the drawings show in schematic, or omit, parts that are not essential in that drawing to a description of a particular feature, aspect or principle of the invention being disclosed. Thus, details of one embodiment of one feature may be shown in one drawing, and the details of another feature will be called out in another drawing.

Figure 1:
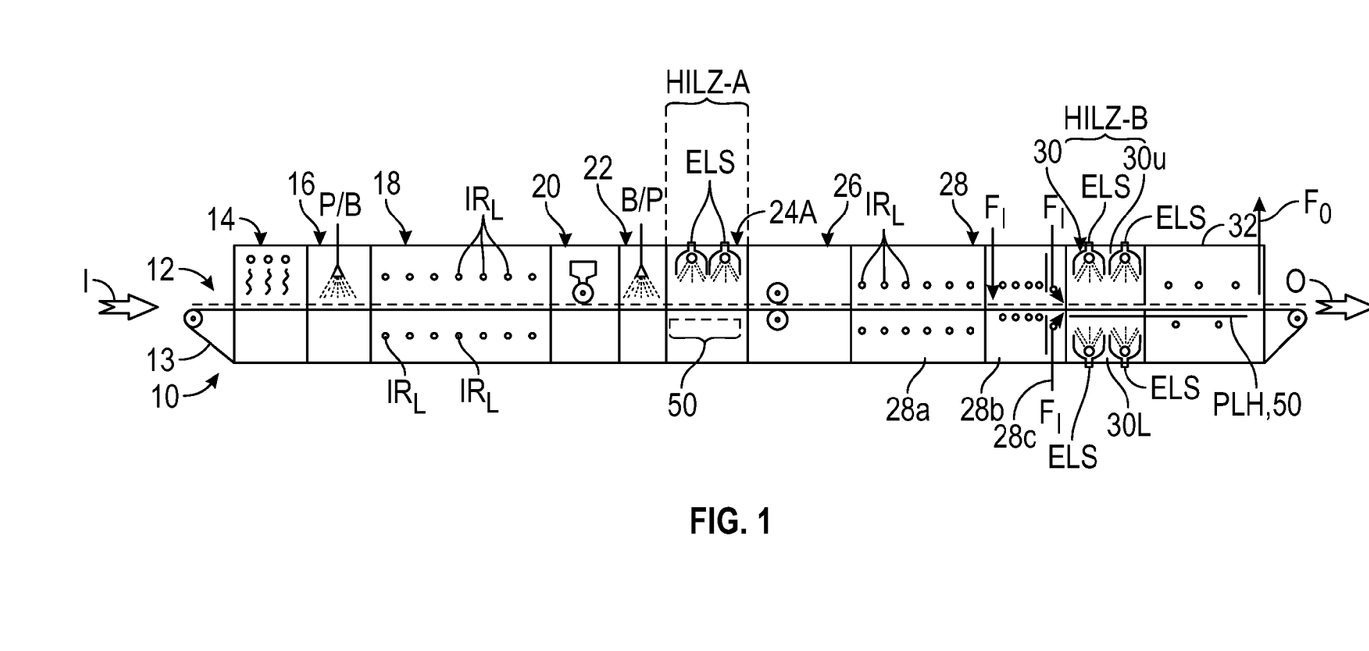
FIG. 1 is a schematic of a full wafer processing line showing by way of example, alternate LEP module locations A and B, as well as alternate Boron application locations and modules.

FIG. 1 shows a schematic of an exemplary solar cell wafer integrated processing line apparatus 10 in accord with the invention, in which prepared wafers 12 are continuously transported during processing from the input end, I, to the output end 0 in the direction of the arrows via a conveyor transport system 13, in this embodiment via a finger transport system as disclosed in detail in our U.S. Pat. No. 8,829,396. UV module 14 provides a zone for UV pre-treatment to one or both the top or/and bottom surface of the wafers 12. Doper 16 applies a P-containing compound or solution (e.g., concentrated phosphoric acid) to the upper surface of the wafers 12. Optionally, the wafers can be flipped-over (not shown) and the bottom surface coated with a B-containing compound or solution (e.g., boric acid) at this stage 16. The surface-coated wafers are dried with high-intensity IR Lamp(s) and fed into and through an IR-Lamp heated diffusion furnace 18 for diffusion firing of the P or co-firing of the P and B into the wafer silicon to dope it. The high-intensity IR Lamps in the diffusion furnace 18 are designated $IR_L$ in FIG. 1. Exemplary UV pre-treaters, dopers, driers and firing furnace apparatus and operational methods are disclosed in our U.S. Pat. No. 8,742,532. Introduction of P and/or B is shown schematically in FIG. 1 via sprayers identified "P/B" for zone 16 and "B/P" for zone 22, respectively.

Following the diffusion firing zone 18 is an ARC coating apparatus 20, which coats an anti-reflective coating onto the P-doped upper surface of the wafers. Optionally, following ARC coating in zone 20, the wafers can be flipped-over and the bottom side doped with a B-compound in zone 22 and dried. In that case, the wafers are then flipped again for introduction into ELS-containing HILZ apparatus 24A (ELS/HILZ Zone A) wherein the top or/and bottom surface(s) are exposed to high-intensity full visible spectrum radiation, HILR, by ELS lamps (disclosed above, and in more detail below). The number of ELS lamps in zone 24A will be selected for the desired exposure dwell time at the selected, controlled transport conveyor rate of the furnace, and the light intensity within the range of from about 3 Sols to about 10 Sols. Exemplary lamps are LEP, Xenon, Halogen or LED type lamps to provide the high-intensity full-spectrum light radiation, HILR. The HILR exposure treatment in ELS/HILZ zone 24A may also be accompanied by exposure to a forming gas having from 2-90% $H_2$ and the balance $N_2$. The wafers may be heated to within the range of from about 100° C. to about 300° C., e.g., by a platen heater or resistance coils, 50, disposed beneath the wafers and located in the gap between the transport fingers. Optionally, the wafers may be heated from below or/and from above by use of suitably located high-intensity IR lamps of the type used in the diffusion or metallization furnaces of this line.

The irradiated wafers exit ELS/HILZ Zone A, 24A, into printer 26 which applies a fine grid of Ag-based paste to the top (P-doped) surface of the wafers and a full surface area, Al-based paste to the bottom (B-doped) surface of the wafers, and dried. The doped, diffusion-fired, ARC-coated and printed wafers (and optionally irradiated) are then fed into a multi-zone, high-intensity, IR-Lamp heated metallization furnace 28, which includes a burn-out and pre-heat zones 28a, a peak firing zone 28b, and a quench zone 28c containing air knives to quickly cool the wafers from peak firing of in the range of from about 800° to about 1050° C. The high-intensity IR lamps in the metallization furnace 28 are designated $IR_L$ in FIG. 1.

In this example a metallization furnace having one or more isolation lamp module(s) forming the peak firing zone 28b includes a quartz window separating the wafer processing zone through which the transport drive moves the wafers from the high-intensity IR lamp zone. This isolation configuration permits supply of the forming gas to the wafers in the peak firing zone, and in the adjacent downstream ELS/HILZ Zone B, 30. In FIG. 1, the forming gas is shown as introduced via lines $F_I$. In addition, the quench zone 28C of the firing (metallization) furnace 28 employs "air" knives with compressed gas streams directed to the top and bottom of the wafers to instantaneously cool them from the peak firing temperature down to the processing temperature of the ELS/HILZ Zone B. The "air" knives can employ compressed forming gas to maintain continuity of the atmosphere of H2/N2 from the peak firing zone, through the quench zone and into the ELS/HILZ Zone B. In addition the next downstream zone, Annealing Zone 32 optionally may also be maintained under H2 with the forming gas introduced into the firing zone 28b, and the quench zone 28c, flowing with the wafers through the ELS/HILZ Zone B, 30 and thence into the Annealing Zone 32, from which it is ultimately exhausted and burned off. In addition, either or both the ELS/HILZ Zone 30 and the Annealing Zone 32 may include platen heaters or open coil resistance element below the wafers, indicated as PLH in FIG. 1. Excess forming gas is withdrawn from the Annealing Zone 32 via exhaust $F_O$, and may optionally be removed at the curtain walls defining the downstream end of zones 28b, 28c and 30, as needed (not shown). In the ELS/HILZ Zone B, 30, the ELS lamps may be disposed above, and optionally also below, the wafers, indicated, respectively as upper lamps 30U and lower lamps 30L.

Figure 2:
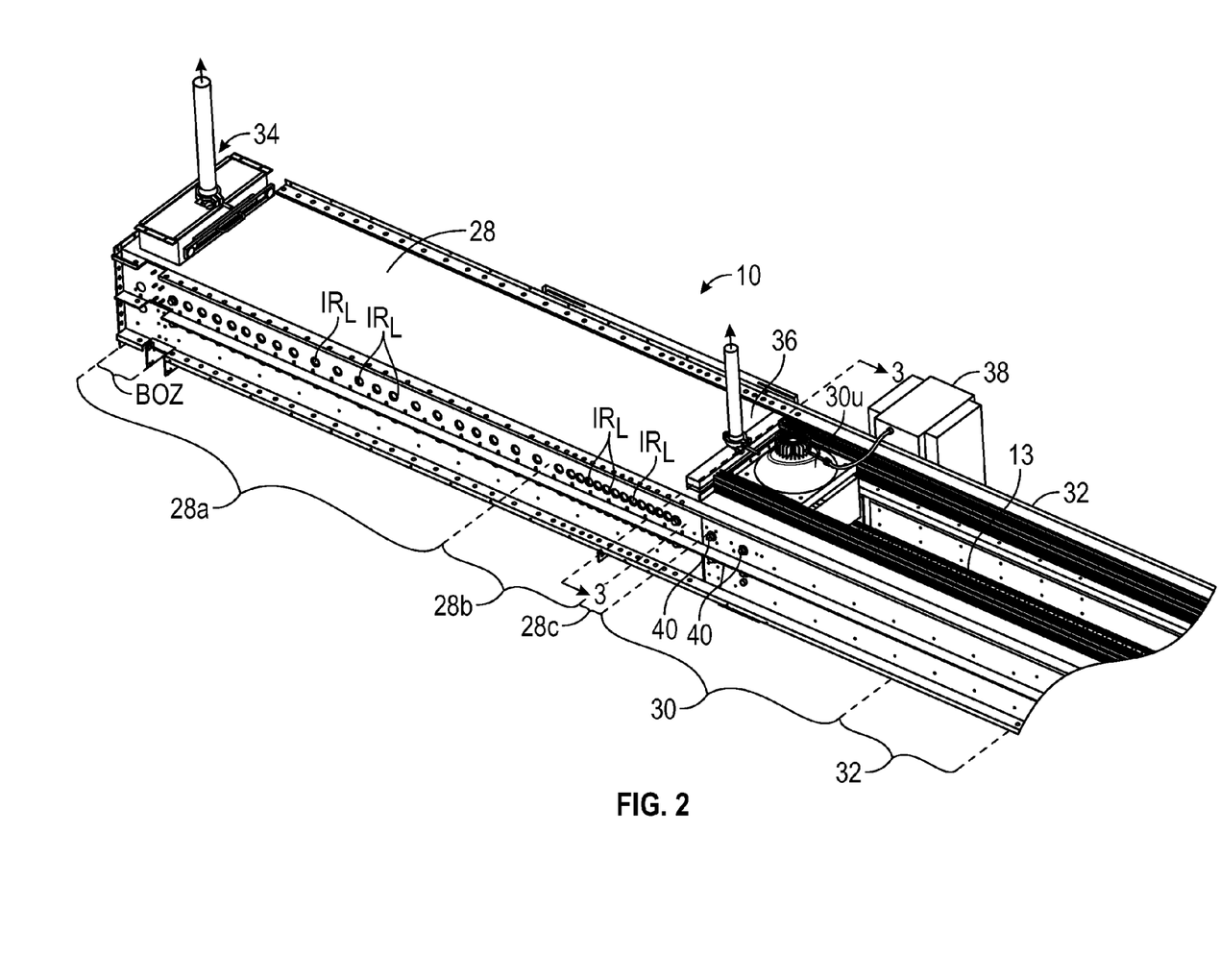
FIG. 2 is an isometric view of a furnace showing a high-intensity HILZ radiation module of the Example I type disposed downstream of the firing/quench zones.

FIG. 2 shows in isometric projection, the Metallization firing furnace 28, followed by the ELS-containing HILZ Zone B, 30, and the Annealing Zone 32. The metallization furnace is disposed upstream of, and connected to the HILR treatment zone, HILZ-B. The finger drive wafer transport system 13 can be seen in the right hand section of the ELS/HILZ Zone 30 and Annealing Zone 32, in which the ELS modules and housing for the top of the annealing zone have been removed to show detail. The conveyor system of the metallization furnace is extended into and functions as the HILR treatment zone, HILZ-B so that the transport of the wafers is continuous through the integrated processing apparatus.

The left end of FIG. 2 shows the initial burn-out zone BOZ of the pre-heat section 28a, with the manifold and volatiles exhaust pipe assembly 34 collecting the paste volatiles burnt out of the printed wafer coatings being removed at that point. The ports in the sides of the furnace sections are labeled $IR_L$ as in FIG. 1. As shown there is a greater concentration of the high-intensity IR lamps in the peak firing zone 28b. The quench zone 28c includes an exhaust plenum and stack 36 as needed. Shown for the ELS in this embodiment is an upper LEP-type Lamp module 30U, connected to its power supply 38 (which may be separately cooled, not shown). Coolant fluid, such as air and/or water, to cool ELS/LEP Lamp 30 U is introduced or/and withdrawn via lines 40. The Annealing zone 32 comprises a forced air cooling housing to anneal the wafers and reduce the temperature of the wafers so they can be handled at the output end of the line (see FIG. 1).

Figure 3:
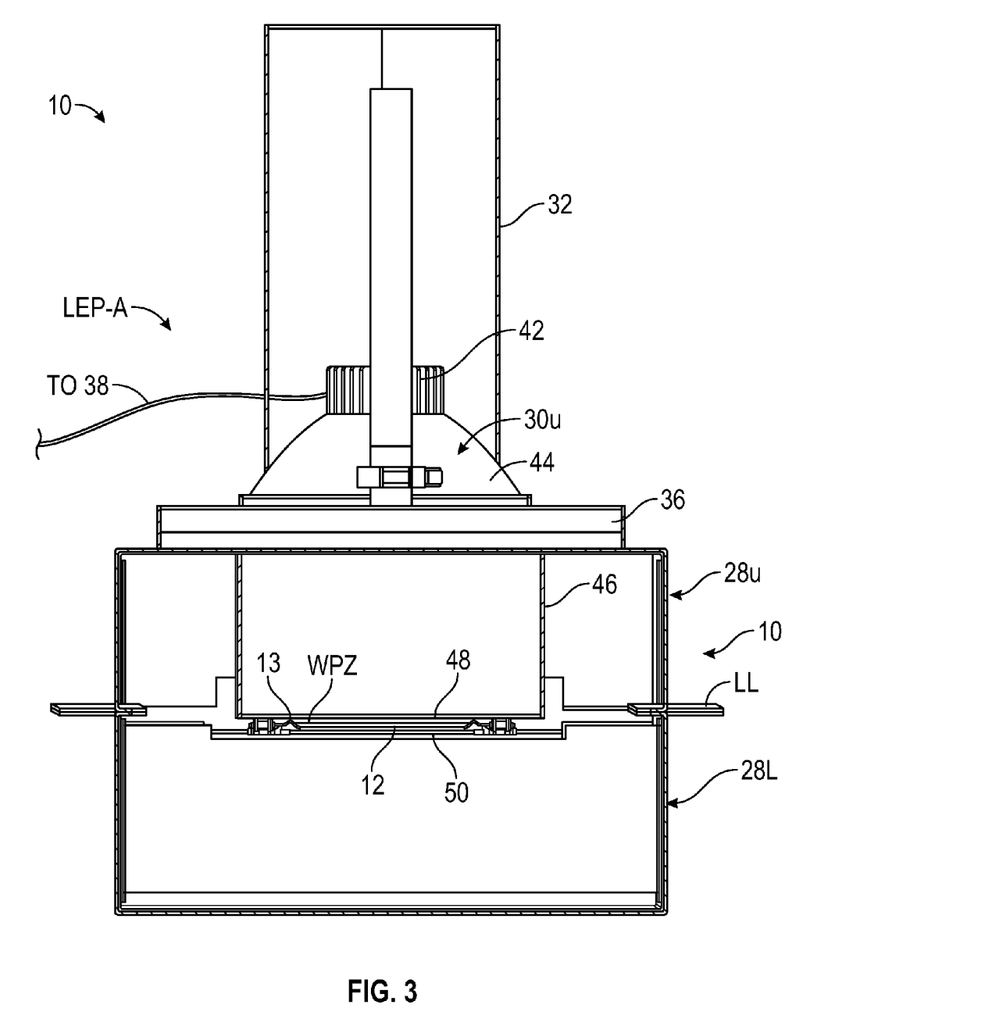
FIG. 3 is a vertical section view along line 2-2 of FIG. 2 showing the Example I-type ELS module and shroud above the wafer line, in this example a finger drive transport system being illustrated.

Continuing with the embodiment in which LEP-type ELS lamps are used in the HILR treatment zone, HILZ-B, FIG. 3 shows in transverse section view along line 3-3 of FIG. 2, the ELS/LEP Lamp module 30U, disposed in association with the finger drive transport conveyor 13 carrying wafers 12 through the various zones of the furnace 28. In this example, the furnace 28 is a top lift design in which the upper half 28U, defined along Lift Line LL, is lifted above the fixed lower half 28L. This permits access to the lower half of the furnace for servicing. When there are no wafers being carried by the finger drive 13, access can be had into the lower half of the furnace as well for servicing. The ELS/LEP module of HILZ-B, 30U, comprises a lamp emitter head assembly 42 connected to the power supply 38 (see FIG. 2) and mounted on a bell housing 44 within which is a parabolic reflector (not shown in this figure). In turn the bell housing 44 is mounted on side walls 46 which define a light concentrating shroud. The bottom of the ELS/LEP module is sealed with a quartz, Vycor, or other high temperature transparent glass window 48 so that the wafer process zone, WPZ, is sealed off and self-contained to permit introduction of forming gas in the WPZ to assist in passivating BOC under the high-intensity light radiation of the HILZ lamps. The downstream annealing zone exhaust shroud 32 is seen behind the ELS/LEP module 30U. A resistance heater or hot water heated platen 50 may be disposed below the wafer.

Figure 4:
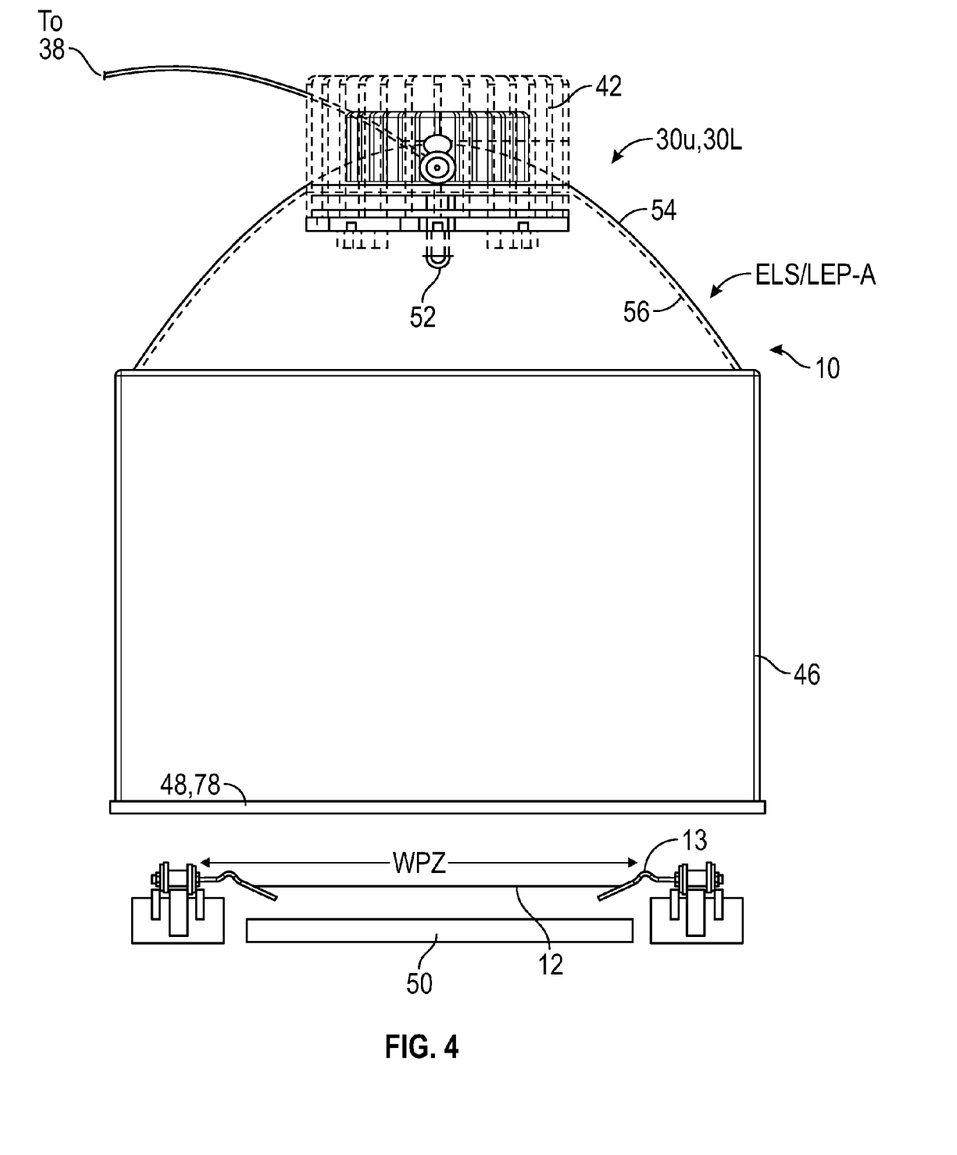
FIG. 4 is a vertical view, partly in section of the Example I-type ELS module of FIGS. 1 and 2 showing the light source and the reflector, as well as the housing in relation to a wafer being transported by a finger drive transport system.

FIG. 4 shows a schematic internal cross section of an ELS/LEP, Example I module 30U or 30L. The lamp head 42 includes the RF plasma emitter 52. The emitter head assembly 42 is mounted on a parabolic reflector 54 having an internal surface 56 coated or formed of high reflectance material. The reflector is mounted on the side-wall housing 46, which is generally square in plan view and the inside walls of which may also be coated with, or formed of, a high reflectance material. The bottom is preferably sealed with a quartz window 48 in the process embodiment employing a forming gas. The ELS/LEP module is shown suspended disposed above the finger drive transport system 13, carrying the wafers 12 through the concentrated, collimated spot of high-intensity light developed by the emitter. The wafers are heated from below in this example by a platen heater 50, or optionally an open coil resistance heater, to within the temperature range of from about 100° C. to about 300° C.

Figure 5:
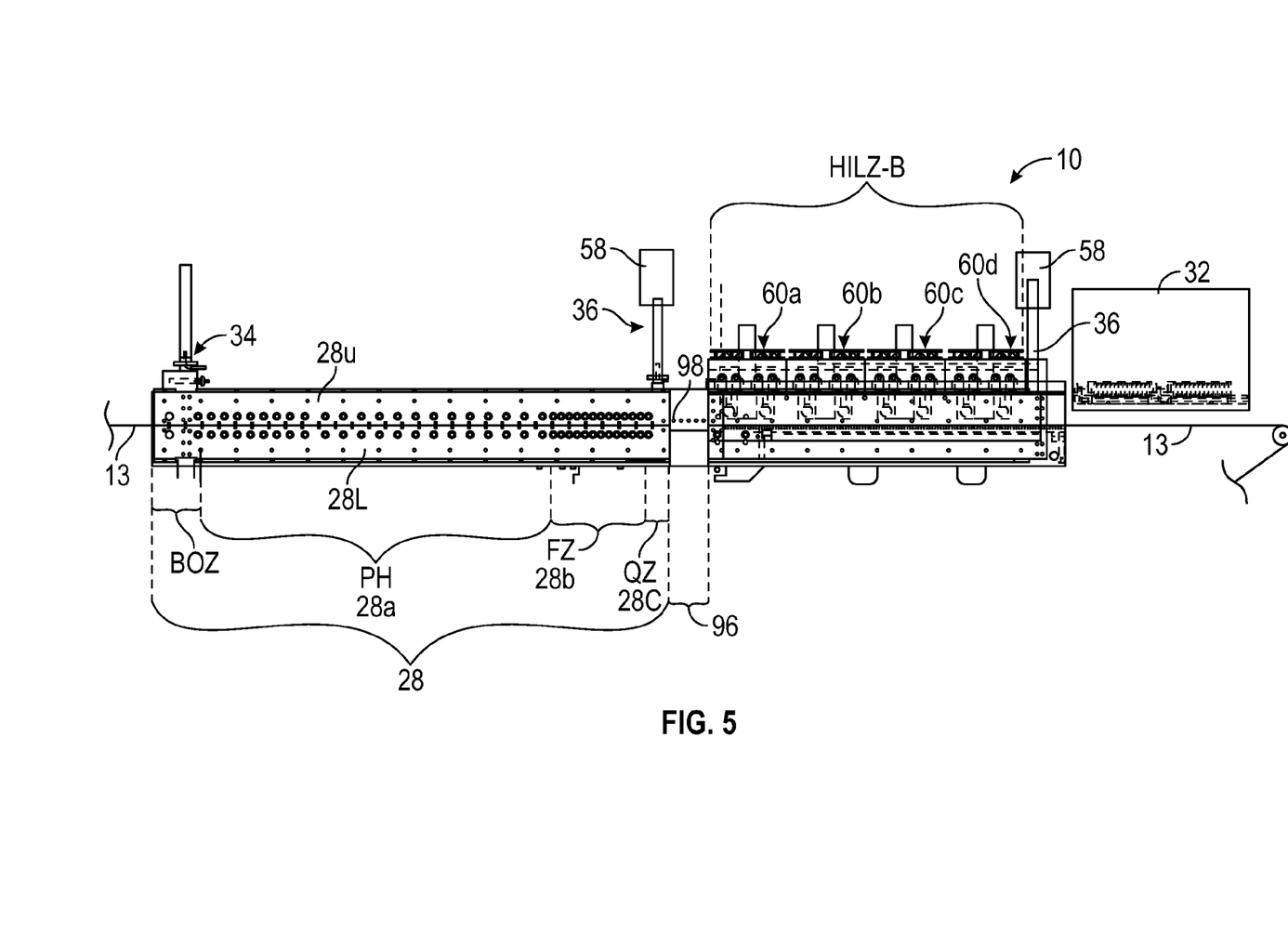
FIG. 5 is a side elevation of a metallization furnace employing a plurality of Example II-type ELS modules (LEP lamps), in series, downstream of the furnace quench zone, in this example the LEP modules being integrated in the line upstream of an annealing zone.

FIG. 5 is a side view of a second embodiment of the inventive furnace in which the ELS/LEP Lamp assembly 10 employs the Example II lamps. The furnace section 28 is as described above. The HILR ELS/LEP Lamp section, HILZ-B, includes, in this example, 4, multi-bulb high-intensity, air and/or water cooled lamp assemblies 60a, 60b, 60c and 60d, arrayed in series, just upstream of a forced air annealing section 32. In this example, forming-gas exhaust manifolds 36 include $H_2$ oxidizer (igniter) assemblies 58 mounted atop the flue pipes to burn off excess forming gas at the ends of the HILZ-A or HILZ-B.

Figure 6A:
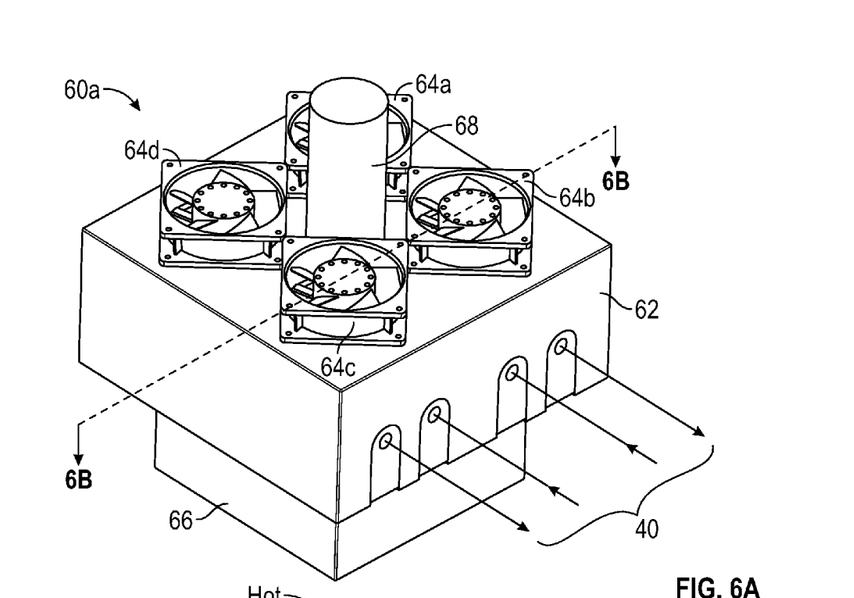
FIG. 6A is an isometric of the Example II ELS module showing a housing containing four LEP light sources.
Figure 6B:
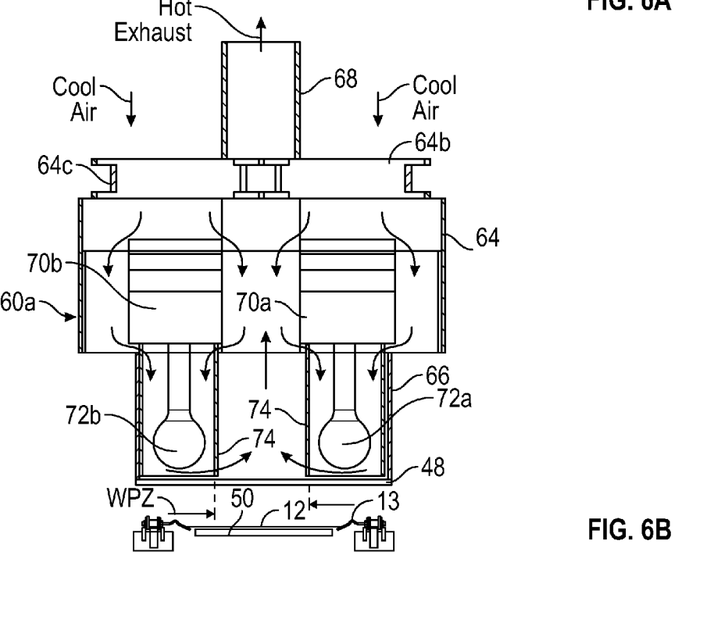
FIG. 6B is a partial vertical section view along line 6B-6B of FIG. 6A showing one example of a cooling air flow path, the wafer transport being shown below the LEP lamps and the wafers heated by a platen heater.

FIGS. 6A and 6B show the details of the Example II ELS/LEP lamp modules 60a-d. FIG. 6A shows module 60a in isometric projection, comprising upper housing 62 on which are mounted an array of four cooling air input fans 64a, 64b, 64c, and 64d disposed around a central exhaust duct 68. The upper housing is connected to a lower housing 66. Cooling water lines may be used to cool the plasma drivers in the upper housing 62. FIG. 6B shows in vertical section view taken along the line 6B-6B of FIG. 6A, the location of the ELS/LEP lamp module 60a disposed above the wafer finger drive transport system 13 carrying the wafers 12, below which is disposed an optional platen heater 50. The plasma drivers 70a and 70b are shown disposed in the upper housing (the electrical supply and cooling water lines are not shown for clarity). As shown by the arrows representing air flow, cool air is injected in the top of the upper housing by the fans 64b and 64c. The air circulates around the drivers, and then down into the lower housing 66 which contains the plasma bulbs 72a, 72b from which the high-intensity full-spectrum light is generated and directed down onto the wafer 12, just below. Collimators 74 may be used to direct the generated light down onto the wafers. The optional quartz window 48 at the bottom of the lower housing assists in containing the flow of air, and directing it to the central flue 68, where it is exhausted as hot air. The Wafer Processing Zone, WPZ is defined below the window in the path of transport of the wafers as shown. It should be understood that while a single finger drive system 13 is shown carrying a wide wafer 12 in a single processing lane defined by the plane of the wafer transport, dual-lane, side-by-side wafer transport Lines A and B may be used, with the wafers in each respective Line A and Line B centered under the ELS/LEP bulbs 72a and 72b, respectively.

FIGS. 7A-D show embodiments of ELS lamp module(s) 30 disposed in the HILZ-B LID treatment zone (see FIG. 5 for location) employing the Example II, lamps, LEP-type high-intensity full-spectrum lamp bulb 72 within a cylindrical wire mesh or perforated metal radiation shield 86. The ELS lamp modules 30 are arrayed longitudinally in series as shown in FIG. 5, to provide the selected HILZ dwell time for treatment. In FIGS. 7A-7D the wafer transport path is left to right as indicated by Arrow T.

Figure 7A:
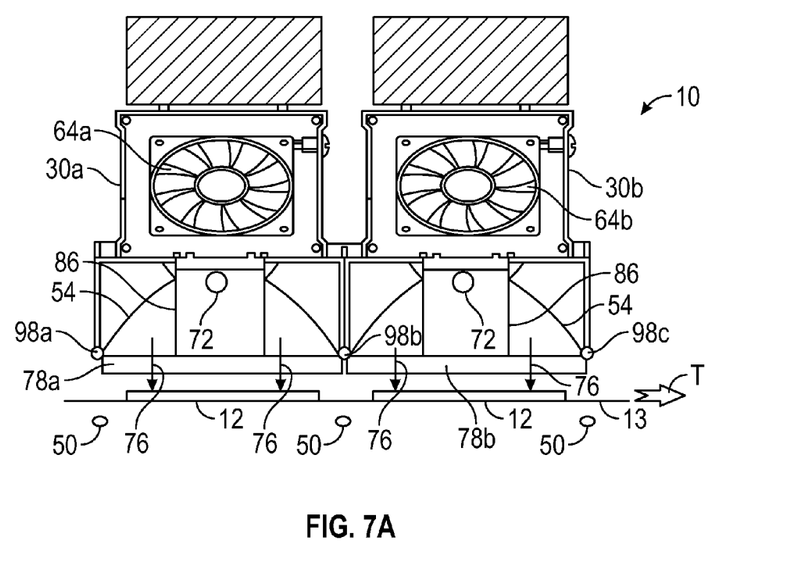
FIG. 7A is a side elevation view of a pair of ELS lamp modules of the HILZ-B zone upstream of an annealing zone as in FIG. 5 showing the use of a light mask and the relation to the wafers being transported in one or two lines.

Alternately, FIG. 7A may be viewed as a lateral section view, in which case the transport conveyor(s) are moving toward the viewer and this perspective shows the embodiment of two, side-by-side processing lanes of a dual-lane furnace. In either viewing aspect, the ELS lamp modules 30a, 30b are abutting, but may be spaced apart either longitudinally for a shadow zone, or in the case of a dual-lane furnace, they are spaced apart to provide clearance for the transport mechanism of the lanes. The LEP bulb 72 is located at the focal point of a parabolic reflector 54 which collimates the high-intensity full-spectrum light radiation downwardly onto the wafer 12 being transported by conveyor 13 in direction T. The collimated downwardly directed light is shown schematically by arrows 76. As an alternative to using a parabolic reflector, a collimating Fresnel lens may be used, spaced just below the bulb in the LEP lamp housing 30. When using a Fresnel lens, the parabolic reflector is not required. As before, the fans 64a, 64b cool the respective LEP lamp modules.

Figure 7B:
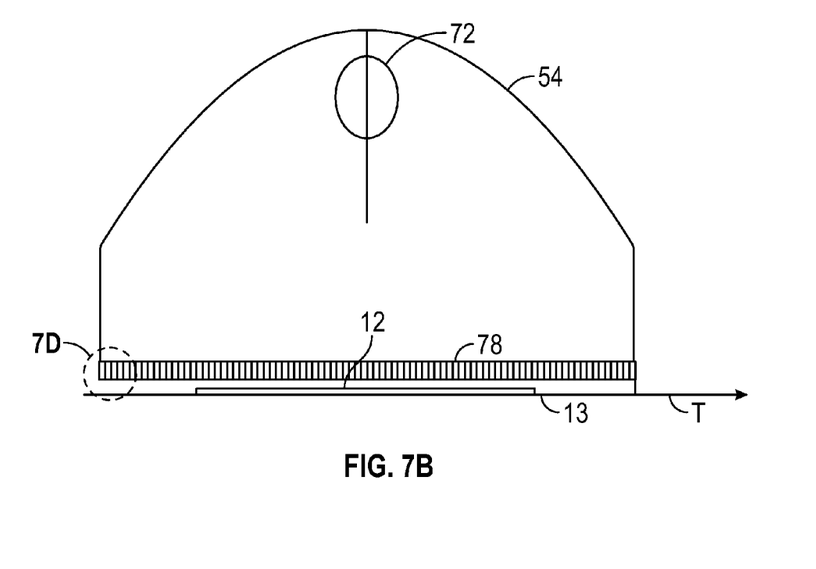
FIG. 7B is a section view, taken along the longitudinal center of an ELS of FIG. 7A, showing the location of the shadow mask with reference to the ELS bulb and the wafer transport.
Figure 7C:
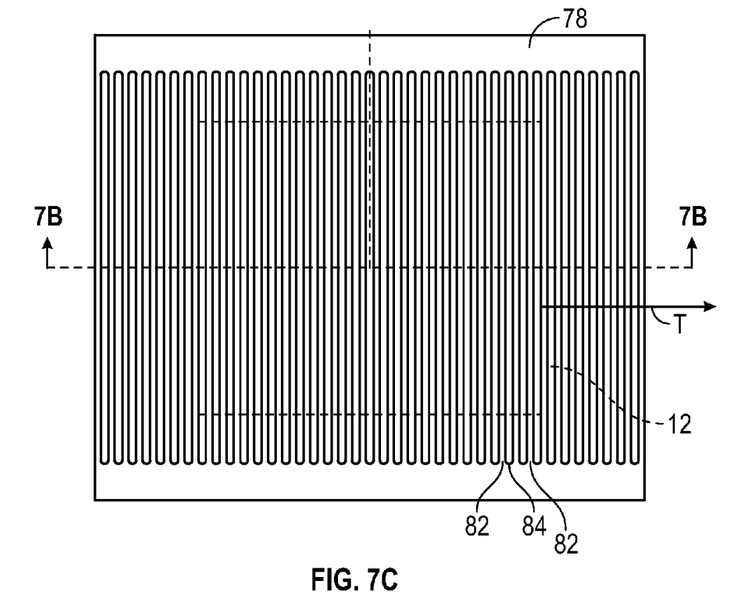
FIG. 7C is a plan view of an ELS shadow mask for producing the reduced-intensity shadow lines for intermittent ON-OFF illumination exposure (strobing) to wafers as they pass under the ELS lamps during processing in the HILZ.
Figure 7D:
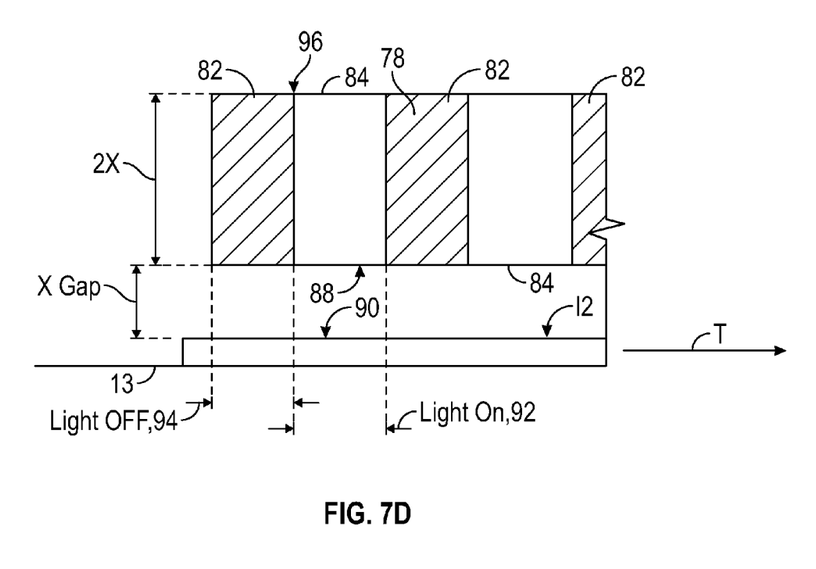
FIG. 7D is an enlargement of a section of the shadow mask of FIGS. 7B and 7C showing the proportions of mask thickness, gap to the top surface of the wafer and the Light ON and OFF intervals.

In the embodiment calling for intermittent light exposure treatment of the wafers, FIGS. 7A-7D show use of a shadow mask 78 to produce intermittent ON-OFF illumination (strobing) as the wafers pass under the ELS lamp modules 30 in the HILZ-A or HILZ-B. FIGS. 7C and 7D show details of one embodiment of a shadow mask, in this example a metal plate such as aluminum having precise slots 84 cut therein to produce alternating lands 82 between the slots 84. In FIG. 7B the location of the mask as fixed in place to span the aperture of the reflector 54 is shown, with the travelling wafer 12 disposed closely beneath the bottom surface of the mask. In FIG. 7C the wafer 12 is just visible through the slots of the mask 78. To reduce unwanted reflections and penumbra, the slotted Al mask 78 is anodized black.

The mask slots also assist in collimating the light, so that as the wafer passes underneath it, see FIG. 7D, the wafer is alternately exposed to the full-spectrum high-intensity light radiation, followed by a dark interval, then light, and so on. FIG. 7D also shows exemplary proportions of the mask 78 with respect to the distance to the top surface 90 of the wafer 12 as it passes underneath on conveyor 13. In the FIG. 7D example, where the slotted mask plate 78 has a thickness 2x, the gap between the bottom of the mask 88 and the top surface 90 of the wafer is half that, i.e., the distance is x. In this example the widths of the mask lands 82 and the slots 84 are the same, so the "Light ON" interval 92 is equal to the "Light OFF" interval 94. These On/OFF intervals may be lengthened or shortened simply by use of a different mask having a different alternating pattern of widths of lands and slots. In the alternative, increasing or decreasing the rate of travel of the conveyor 13 can control the strobing rate (intervals). Where a forming gas is used in the HILZ, when a slotted metal mask is used, a glass plate is placed below the mask in contact with its surface 88, or placed on the top surface 96 of the mask illumination period in the range of 10-60 seconds. Both Test Series subjected the treated wafers to sunlight exposure (one week) to simulate in-use service to demonstrate LID; both Test Series exhibited unexpectedly improved LID reduction, as follows:

TABLE 1

Test Series I

| Test I Wafer # | HILR Exposure In ELS? | Solar Conversion Efficiency (SCE) As Produced, % | SCE, After Test Exposure, In-Use Simulation, % | Light Induced Degradation, LID, % Reduction in SCE | Reduction of LID, % Compared to A |
|---|---|---|---|---|---|
| A | No (Ref.) | 20.56 | 20.51 | 0.244 | N.A. |
| B | Yes | 20.66 | 20.65 | 0.048 | 19.7 |
| C | Yes | 20.20 | 20.22 | +0.09 (SCE Increase) | 136.9 |

As an option to using a shadow mask, a horizontal, rotating thin plate having one or more slots therein at the output aperture of the ELS lamp module may be used. In another alternative, the ELS lamp modules may be spaced apart with suitable vertical shielding extending downwardly to close to the wafer top surface 90 so that the wafers traverse a dark zone between the longitudinally spaced-apart lamps. As an alternative to the use of a slotted metal shadow mask 78, the shadow mask may be a glass plate having dark lines formed on its surface, e.g., by vapor deposition or sputtering thereon a metal layer or opaque oxide layer. The glass may be Vycor, quartz or a high-temperature borosilicate glass. In this alternative embodiment, the shadow mask plate can thus double as the isolation window, permitting use of a forming gas in the wafer-travel processing space, WPZ (see FIG. 6B). In still another embodiment, the shadow mask may be a moving mask rather than fixed in place, such as by use of a slotted, solid belt that is disposed to move in a horizontal path, parallel to the path of the wafers through the HILR treatment zone, HILZ-A or HILZ-B, and located between the output of the ELS module and the wafers to cast alternating bands of HILR and shadow on the wafers passing therebelow. Control of the speeds of the wafer conveyor and the belt mask permits a wide range of intermittent exposure, ON/OFF, strobing intervals. The slotted belt may be moving in the same direction as the wafer transport through the HILR treatment zone, or countercurrent to it (opposite direction), as desired. Belt turners, e.g., angularly-disposed rollers, may be used to divert the belt out of the way of the ELS modules on the return path.

In the preferred shadow mask embodiment, the width and number of the mask shadowing lines are selected with respect to the light output aperture of the ELS module (e.g., 210 mm width) for a standard 6" wafer being transported along the processing line and the conveyor transport speed (by way of example, 230 inches/minute), to provide rapid strobing (ON) effect on the top surface of the wafer on the order of less than 1 second light radiation exposure between shadow (OFF) modes. The ON/OFF intervals may be equal or unequal as noted above.

Process Examples with Unexpected Results

By way of example of the HILR processing method of this invention, mono-Si solar cell wafers treated with full-spectrum HILR employing an ELS of the apparatus disclosed herein were tested for LID reduction in two series of tests: Test I Series, at 5 Sols intensity with heating at between 150° C.-230° C. for a continuous illumination period in the range of 60-180 seconds; and Test II Series, at >5 Sols intensity with heating at between 230° C.-300° C. for a continuous Test I series results show that longer ELS high-intensity full-spectrum exposure of the wafer top surface produces greater LID reduction, with doubling of time cutting the LID effect (reduction in SCE) by half or more. In addition, that doubling of exposure time effect holds true at all temperatures in the range, but the greater reduction of LID occurs at hotter temperatures in the range.

TABLE 2

Test Series II

| Test II Wafer # | HILR Exposure In ELS? | Light Induced Degradation, LID, % Reduction in SCE | Reduction of LID, % Compared to A |
|---|---|---|---|
| A | Reference | 0.06 (Normal) | N.A. |
| B, D | Yes | 0.03 | 50. |
| C | Yes | 0.04 | 33.3 |

Test Series II shows that at higher temperature and higher intensity of the HILR, the treatment time can be reduced to under 1 minute with unexpected reduction in LID, 50% in these exemplary tests.

It will be understood by one of ordinary skill in this art that the one-week sunlight exposure to simulate in-use operation is relatively short, and that the LID is known to increase over time. Indeed, test Wafer # C, Series I, exhibited not only no LID, but an improvement over its initial SCE as a result of HILR treatment. That is, the 136.9% reduction in LID may be interpreted as not only no LID effect during use, but indeed, improvement in SCE during operation. Thus, with longer sunlight exposure, the reduction in LID as a result of the inventive HILR method of wafer treatment will have an even greater impact with a more substantial improvement in SCE over the useful life of the wafers in a solar cell array. The Test Series II shows that the inventive process can be integrated into a wafer processing line, such as a metallization furnace, and treat wafers at a rate matching the rate of exit of the wafers from the furnace firing/quench zones.

INDUSTRIAL APPLICABILITY

It is clear that the inventive HILR treatment apparatus and methods of this application has wide applicability to the solar cell processing industry, namely to LID reduction, whether through BOC formation prevention, BOC deactivation, or BOC passivation, and to restoration of the solar energy conversion efficiency of solar cell wafers back or close to original values, and that the rate of HILR treatment can match wafer firing furnace output. Thus, the inventive system has the clear potential of becoming adopted as the new standard for apparatus and methods of LID reduction in the solar cell wafer processing industry.

It should be understood that various modifications within the scope of this invention can be made by one of ordinary skill in the art without departing from the spirit thereof and without undue experimentation. For example, the ELS high-intensity light modules can have a wide range of types, designs and locations in the integrated processing line to provide the full-spectrum functionalities at in the range of intensity (3-10 Sols) disclosed herein. This invention is therefore to be defined by the scope of the appended claims as broadly as the prior art will permit, and in view of the specification if need be, including a full range of current and future equivalents thereof.

Parts List (This Parts List is provided as an aid to Examination and may be canceled upon allowance)

10 Inventive solar cell wafer processing system
12 Wafers 13 transport conveyor
14 UV pre-treatment
16 Doper module for P/B doping
18 Diffusion Furnace
20 ARC coating apparatus
22 Optional B doping
24 A, B Hi-intensity full-spectrum ELS-containing HILZ
26 Printers
28 a, b, c Hi Intensity IR Metallization Furnace
30, U, L Hi-intensity full-spectrum ELS-containing HILZ
32 Annealer
34 Burn out zone exhaust
36 Peak Firing Zone exhaust
38 Power supply & cooling system
40 Water/air cooling inputs/outputs
42 Lamp head
44 Bell housing of LEP 30U
46 Lower side walls/shroud
48 Quartz window
50 Platen or resistance coil heater
52 LEP RF/plasma emitter
54 Reflector
56 High reflectance coating
58 $H_2$Oxidizer
60 Lamp Assys of LEP Zone B
62 Upper housing
64 Fans a-d
66 Lower housing
68 Central exhaust duct
70 Plasma drivers
72 Emitter bulbs
74 Collimator tubes
76 Collimated light
78 Shadow masks, e.g., slotted metal
82 Lands in metal, or lines on glass of shadow mask
84 Slots in metal or unlined glass areas of shadow mask
86 Radiation shield (wire mesh or perforated metal sheet)
88 Bottom surface of shadow mask
90 Top surface of wafer
92 "Light ON" interval
94 "Light OFF" interval
96
98
100
102
104
106
108
110
112
114
116
T direction of wafer transport travel through Process Zone
PLH Platen heater (or equivalent, resistance coil heater)
$F_I$ Forming gas input -continued $F_O$ Forming gas output
$IR_L$ High-intensity IR lamp
BOC Boron-Oxygen Complex
BOZ Burn-out zone
PH Preheat zone
FZ Firing zone
QZ Quench zone
LEP A Light Emitting Plasma Zone A
LEP B Light Emitting Plasma Zone B
WPZ Wafer Processing zone
LL Lift line
I Input
O Output
B/P or P/B, Boron/Phosphorous

The invention claimed is:

1. Method of treating Si wafers for solar cells to reduce Light Induced Degradation (LID) resulting from in-use operation of said solar cells during exposure to sunlight, comprising the steps of:
   a. orienting a plurality of Si wafers having top and bottom planar surfaces with said top surfaces facing upwardly;
   b. transporting said plurality of Si wafers continuously and sequentially in a linear direction through a treatment zone in a generally horizontal processing path;
   c. exposing said top surfaces of said Si wafers with full-spectrum light radiation from Light Emitting Plasma (LEP) lamps, in an amount of 3 Sols to 10 Sols for a time period of from 10 seconds to 5 minutes sufficient to reduce LID that would otherwise be exhibited by said wafers; and
   d. heating said wafers during exposure to said full-spectrum light radiation by use of Infrared Radiation (IR) lamps directed onto said top surfaces of said Si wafers, said IR wafer heating lamps being controlled separately from said Light Emitting Plasma (LEP) lamps, to maintain a temperature of said wafers in a range of 100° C.-300° C.

2. Method as in claim 1 wherein said step of exposure of of said top surfaces of said wafers to said full-spectrum light radiation is controlled so that said exposure is intermittent, alternating between said full-spectrum light radiation impinging on said wafers surfaces, ON, and said full-spectrum light radiation not impinging on said wafers surfaces, OFF.

3. Method as in claim 2 wherein said IR wafer heating lamps are maintained ON during said step of intermittent exposure of said wafers to said full spectrum light from said LEP lamps to maintain said wafer temperature within said range of 100° C.-300° C.

4. Method as in claim 1 which includes a step of firing said wafers prior to said full-spectrum light radiation treatment so that said wafers firing and said full-spectrum light radiation treatment of said wafers comprise a sequentially continuous process.

5. Method as in claim 1 wherein said LEP and IR lamps are disposed in an alternating array above the top surface of said wafers.

6. Method as in claim 5 wherein said LEP lamps are separated from said wafer transport path by a window selected from a group comprising of quartz, Vvcor and high temperature transparent glass.

7. Method as in claim 6 which includes a step of providing a forming gas consisting essentially of $H_2$ in said treatment zone.

* * * * *